(12) United States Patent
Machida

(10) Patent No.: US 6,442,580 B1
(45) Date of Patent: Aug. 27, 2002

(54) RESAMPLING METHOD AND RESAMPLER CIRCUIT

(75) Inventor: Hirohisa Machida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/357,157

(22) Filed: Jul. 19, 1999

(30) Foreign Application Priority Data

Mar. 11, 1999 (JP) .......................................... 11-065228

(51) Int. Cl.[7] .......................... G06F 17/17; G06F 17/10
(52) U.S. Cl. ....................................... 708/313; 708/319
(58) Field of Search .................................. 708/313, 319

(56) References Cited

U.S. PATENT DOCUMENTS

| | | | | |
|---|---|---|---|---|
| 5,258,939 A | * | 11/1993 | Johnstone et al. | 708/313 |
| 5,349,548 A | * | 9/1994 | Nillesen | 708/313 |
| 5,436,859 A | * | 7/1995 | Lunner et al. | 708/313 |
| 5,732,004 A | * | 3/1998 | Brown | 708/313 |
| 5,751,615 A | * | 5/1998 | Brown | 708/313 |

OTHER PUBLICATIONS

Proakis, John G. et al., Digital Signal Processing Principles, Algorithms, and Applications, Third Edition, 1996, p. 273.

* cited by examiner

*Primary Examiner*—Tan V. Mai
(74) *Attorney, Agent, or Firm*—Burns, Doane, Swecker & Mathis

(57) ABSTRACT

The resampler circuit according to the present invention is arranged such that the number of multiplication, that is, the number of multiplying means is reduced by storing the coefficients in each of the time intervals between the time point at which the time interval T has elapsed and a predetermined time point in a plurality of ROMs, taking advantage of the symmetrical characteristic of the waveform 1 indicated by the SINC function in the direction in which the number of T increments and that in which the number of −T increments, except the time intervals from the reference time 0, namely [0, T] and [0, −T]. In addition, the ROM size is also reduced by storing in each ROM the coefficients for only a half of each of the time intervals on the basis of the above symmetrical characteristic.

8 Claims, 10 Drawing Sheets

RESAMPLING METHOD AND RESAMPLER CIRCUIT

BACKGROUND OF THE INVENTION

1. Field of the Invention

The present invention relates to a resampling method and a resampler circuit for use in a digital filter, particularly in a so-called interpolation filter, which is installed in a digital decoder or the like and capable of effectuating a timing recovery function.

2. Description of the Related Art

In accordance with the remarkable development in the field of semiconductor technique, conventional analog signal processing employing analog electronic circuit elements such as resistors, capacitors, coils, OP amplifiers and so on is gradually shifting to signal processing in a digital fashion which is the so called digital signal processing, in various fields including the field of communications, audio and/or visual field, as well as the fields of measurement, control and so on.

It is required to transmit digital data or discrete data between systems in which the digital signal processing is essential. However, in a case that digital data is transmitted (for communication), it is normally transmitted to a remote place in terms of distance or time, and due to this, the data transmission side and the data reception side cannot share the same time, whatever the medium for the data transmission is.

FIG. 7 shows an exemplary view for explaining the relationship between transmitted data and a received waveform in a digital transmission system, although it is applicable to many fields other than the field where this digital transmission system is employed.

As shown in the figure, the discrete digital data is transmitted from a transmission side to a reception side at predetermined time intervals. Digital data transmitted by way of a transmission line (such as a cable, a telephone line, wireless communication line and so on) between the transmission side and the reception side is deteriorated during transmission due to the transmission line characteristics, so that the original shape of the digital data is somewhat transformed before it is finally received as an analog waveform data at the reception side. This received data normally contains some noise due to interference possibly caused during data transmission.

A digital signal processing device at the reception side requires a function to recover the data of an analog waveform to the original digital data transmitted from the transmission side, and this recovering process is called a data recovery. On the other hand, in an analog signal processing system, there is no occurrence of data drop or the like from an analog waveform, as the received data of analog waveform can be processed just as it is.

However, in the digital signal processing system, since it is necessary to perform sampling of digital data from the received analog waveform, the data which has not been sampled is regarded as being lost. Therefore, in order to correctly recover the received data at the reception side, the transmission side has to send digital data in accordance with a predetermined protocol.

In short, transmission of digital data from the transmission side to the reception side is equivalent to a transmission of square pulses. Although the square pulse requires a wide-band transmission line as it has a wide frequency spectrum characteristic, the transmission line used for this purpose has to be limited to the frequency band in which the data can be correctly transmitted, as there is a limitation in the frequency resources.

FIG. 8 is an exemplary view showing the transformation of digital data when it is transmitted by way of a low pass filter. For example, when the wide frequency band component of digital data is eliminated by use of a low pass filter, the waveform of the square pulse is transformed to a gentle taper-like waveform as shown in the right-side portion of FIG. 8, resulting thereby in an expansion of the pulse width. In a case that digital data is transmitted by use of a T-width square pulse train, the pulse width is expanded due to the limitation of band width, and as a result, the adjacent pulses are superimposed with each other, causing thereby an interference (intersymbol interference) between the transmission waveforms. In a case that a digital data which is pulse information is transmitted at time intervals of T, if there is no such superimposition of adjacent transmission waves at sampling points T, correct pulse information can be taken out at the reception side even if a distortion has occurred in the transmission waveform.

The Nyquist's first standard is widely known as a condition under which a band limitation is made possible even without generating an intersymbol interference. According to this Nyquist's first standard, the required minimum frequency band that does not cause any intersymbol interference at sampling points of every time interval T is T/2.

FIG. 9 is an exemplary view of a filter characteristic that does not cause the intersymbol interference. In the figure, when a pulse signal is input at timing intervals of T by use of an ideal low pass filter through which only the signal within the frequency band between the frequency f=0 and the frequency f=1/2T (hereinafter referred to just as Nyquist frequency) is allowed to pass, or by use of a low pass filter having an odd-symmetrical transmission characteristic about the Nyquist frequency 1/2T, then a response, namely an impulse response (refer to FIG. 2) becomes amplitude zero at the time point t=±nT, so that even when impulse responses are superimposed with each other, there will be no intersymbol interference generated as long as the data sampling is performed at t=±nT.

There is a roll-off filter as a practical filter that satisfies the Nyquist's first standard. The characteristic of this roll-off filter is a characteristic shown in FIG. 9, and its impulse response is shown as a waveform 1 that can be obtained by the SINC function shown in FIG. 2. However, even when a digital data is transmitted from the transmission side in a state that there is no intersymbol interference as shown above, the data transmission interval T from the transmission side and the sampling interval T of the thus transmitted data at the reception side are not always the same. Generally, in a digital signal processing system, this data sampling interval is generated by a crystal oscillator. However, even if the same crystal oscillator is used at the transmission side and the data reception side, the operation thereof will not be exactly the same.

For example, in a case that there is caused an error of 1 ppm between the crystal oscillator at the transmission side and that at the reception side, if the system is operating at 10 MHz or so, 10 data at every one second can be lagged therebetween. Further, even if the frequency at the both sides are exactly the same, if there is a time lag between the transmitting interval T at the data transmission side and the sampling point at the data reception side, there will be no way to obtain the correct data forever. Further, in the digital transmission system, there is a problem that the sampling points cannot be transmitted from the data transmission side to the data reception side.

Considering the above, the data reception side needs to recover the frequency of the transmission side (data transmission interval) and the sampling point from the received data. The processing operated at the reception side is called a timing recovery, and a block that implements this processing is called a timing recovery circuit.

Conventionally, it has been common to implement this timing recovery circuit by combination of digital processing and analog processing. However, in recent days, there are many types of timing recovery circuits that perform all the operations by use of digital processing only, and this kind of circuit is called a digital timing recovery circuit, or a resampler circuit.

The operation of the conventional digital timing recovery circuit or resampler circuit is now explained below.

FIG. 10 is an exemplary view showing the method of calculating interpolation data.

The conventional resampler circuit has only to calculate an arbitrary timing by interpolating a sampled signal, so that it can be implemented by a low pass filter (FIR—Finite Impulse Response) having a variable coefficient and a limited number of taps. The principle of resampling is shown by the following formula (1)

$$y(t) = \sum_{n=-\infty}^{\infty} x(nT) \cdot \text{SINC}\{(t-nT)/T\} \quad (1)$$

Here, X(nT) represses a sampled signal, SINC( ) represents a SINC function, T represents a sampling interval, and y(t) represents an original analog signal of the sampled signal x(nT) (received waveform).

The above formula (1) is an expression for performing adding operation of the waveform values shown in FIG. 10, and in a case that the time point is T, the value of y(T) will be obtained by the following formula (2).

$$y(T)= \ldots +x(T)\cdot\text{SINC}(0)+x(2T)\cdot\text{SINC}(-1)+x(3T)\cdot\text{SINC}(-2)+ \ldots \quad (2)$$

FIGS. 11A and 11B are exemplary views showing a method of calculating the interpolation data in the resampler circuit.

FIG. 11A shows a resampler circuit having a configuration of the FIR filter with the value n in the formula (1) being specified. Here, SINC(0), SINC(-1), SINC(-2) . . . are coefficients each corresponding to the input value x(nT), and y(T) is a total value to be output resulting from multiplication of each of the coefficients corresponding to each input value x(nT) in the case of n being 0, 1, 2, 3 . . .

Next, in a case of the time point T+t' which has passed for a predetermined time period t' from the time point T, the value of y(T+t') will be as shown by the following formula (3)

$$y(T+t')= \ldots +x(T)\cdot\text{SINC}(t')+x(2T)\cdot\text{SINC}(-1+t'/T)+x(3T)\cdot\text{SINC}(-2+t'/T)+ \ldots \quad (3)$$

When the above formula (3) is implemented in the FIR filter, it becomes a resampler circuit having a configuration of FIG. 11B. In FIG. 11B, although the value of input x(nT) is same as the case for obtaining the value y(T), the coefficients become SINC(t'/T), SINC(-1+t'/T), SINC(-2+t'/T) . . . , and thus this circuit employs coefficients at the time points which have been shifted for the time period t' from the case of y(T) shown in FIG. 11A.

Accordingly, even when the sampling point is defined at timing intervals of T, with the provision of coefficients of the SINC function between the sampling points, an arbitrary value which has not really been sampled between the sampling time points can be calculated. This SYNC function is nothing but an impulse response with respect to the reference pulse (scale 1). After all, the resampler circuit can perform the timing recovery by calculating the digital data which has not been sampled, but even without changing the sampling points by use of the above technique.

In the resampler circuit as explained above, let us consider the case of the coefficients indicated by a SINC function shown in FIG. 2, as to the data processing by the resampler circuit at an arbitrary time point T+t' with the value for n being 10. In FIG. 2, the waveform 1 denotes a SINC function, namely a coefficient by which the data to be sampled is multiplied. The lateral axis denotes a time axis, which expresses the lapse of time from the right toward the left.

In the waveform 1 shown in FIG. 2, if the time point at which the coefficient becomes maximum is zero (hereinafter referred to just as a reference time 0), then the value at the reference time 0 is a maximum value 1 (center tap). Further, the coefficient shown by this SINC function has a value symmetrical to both lateral sides about the time point 0. In either direction from the time point 0 is toward positive or negative (rightward or leftward), the coefficient of the time which is away for absolute time period T therefrom is always 0, and in this case, there is no intersymbol interference. There exists a timing point t' at which the received data is actually sampled within the time interval T. If the sampling period T is an integer value, then t' is a value below a decimal point.

With the condition that the data sampled at time intervals of T are $Z^{-0}, Z^{-1}, Z^{-2}, Z^{-3}, Z^{-4}, Z^{-5}, Z^{-6}, Z^{-7}, Z^{-8}, Z^{-9}$ in the reverse order of time lapse (from left to right in the figure) since the delayed time amount for obtaining the coefficient for the formula for calculating the sampled data is t', the coefficients employed for forming the data to be interpolated will be, as shown in FIG. 2, e, d, c, b, a, a', b, b', c' d' and e' in the reverse order of time lapse. Due to this, the digital data to be interpolated will be obtained by the following formula (4):

$$(Z^{0}\cdot e)+(Z^{-1}\cdot d)+(Z^{-2}\cdot c)+(Z^{-3}\cdot b)+(Z^{-4}\cdot a)+(Z^{-5}\cdot a')+(Z^{-6}\cdot b')+(Z^{-7}\cdot c')+(Z^{-8}\cdot d')+(Z^{-9}\cdot e') \quad (4)$$

Since the conventional resampler circuit is configured as above, it is necessary to operate 10 times of multiplication and 9 times of addition in order to obtain the digital data to be interpolated in the formula (4). In other words, it requires a lot of time to perform arithmetic processing such as multiplication and addition. If such multiplication and addition are executed in parallel in order to reduce the time to be required for execution of the arithmetic operation, then 10 multipliers, 10 coefficient ROMs and 9 adders are required. For this reason, in this case above, there arises a problem that the scale of the hardware becomes too large.

FIG. 12 is an exemplary view showing a conventional resampler circuit, namely a FIR filter which is the circuit for executing the formula (4). In the figure, FF-x, namely FF-0 to FF-99 are registers, each of which is a circuit for storing the sampled data having arbitrary number of bits. When the clock signal CLK is fed to each of the registers FF-x, each one inputs the data in synchronization with the rising or falling edge of the clock signal, retains the thus obtained input data therein, and outputs the data to the next register one after another. Variation of the clock signal CLK indicates the sampling interval of the digital data, that is, the time interval T.

The registers FF-x, namely FF-1 to FF-9 are connected in series, and transmit the sampled data in accordance with the variation of level of the clocksignal CLK from FF-0 to FF-9 in order. The digital data output from the FF-0 is $Z^0$, the digital data output from the FF-1 is $Z^{-1}$, and the digital data output from the FF-9 is $Z^{-9}$. That is, the data of the latest time point is $Z^0$, and that of the oldest time point is $Z^{-9}$.

In FIG. 12, ADDx, namely ADD0 to ADD9 are adders, each of which has function of adding two input digital data, and outputs the thus added result. MPYX, namely MPY1 to MPY9 are multipliers, each of which has a function of multiplying two input digital data with each other, and outputs the thus multiplied result.

ROMx, namely ROM0 to ROM9 are circuits, each of which stores coefficient data of the SINC function. Here, ROM denotes a Read Only Memory (memory that is only for reading out the data therefrom), and is a circuit that externally outputs the data stored in the storage area corresponding to the value input from outside (which is called an address data). Each of the ROMx (x=0~9) is a circuit that inputs the discrepancy t' of the sampling interval as an address and outputs a coefficient value corresponding to the input address data, that is, a function value obtained from the SINC function shown in FIG. 2.

If the time interval between one arbitrary data sampling time T and the next data sampling time T+1 is divided into 128 time points, the discrete digital data are stored as the coefficient values in the storage area within the ROM indicated by the address that corresponds to each of the thus divided 128 time points. In FIG. 12, IN denotes an input digital data to be sampled, and OUT denotes an output digital data to which a timing recovery has already been applied.

As explained heretofore, the conventional resampler circuit requires many arithmetic operations such as multiplication and the like, making thus its processing time long, whereby the hardware scale becomes large as a whole.

SUMMARY OF THE INVENTION

The present invention has been proposed to solve the problems aforementioned, and it is an object of the present invention to provide a method of resampling or a resampler circuit that can be implemented by a relatively small-scale hardware capable of reducing the number of arithmetic operations such as multiplication, the number of multipliers and ROM, and also capable of minimizing the scale of the ROM used and so on.

In order to achieve the above object, the method of resampling according to the first aspect of the present invention comprises the steps of: in a state that a plurality of registers storing input data of time series obtained through sampling operation are divided into a former half group and a latter half group, and positioned in such a manner that the first one of the former group and the last one of the latter group are paired with each other, adding the input data stored in each of the paired registers except the first one of the former group and the last one of the latter group by use of a plurality of first adding means, multiplying the data output from the first register of the latter half group in the plurality of registers by the coefficients obtained from a first storage means storing the coefficients obtained by a SINC function during the time period between a reference time corresponding to a center tap of the SINC function and a first time point which is after a lapse of sampling interval T by use of a first multiplying means, multiplying the data output from the last register of the former half group within the plurality of registers by the coefficients obtained from a second storage means storing the coefficients obtained by the SINC function during the time period between the reference time and a second time point after a lapse of sampling interval −T by use of a second multiplying means, adding the data output from each of the plurality of first adding means and the coefficients obtained from each of a plurality of third storage means storing the coefficients obtained by the SINC function at time intervals −T from the second time point by use of a plurality of third multiplying means each corresponding to each of the plurality of third storage means, adding the data output from the first multiplying means and the data output from the second multiplying means by use of a second adding means, and sequentially adding the result of addition output from the second adding means and the output from each of the plurality of third multiplying means, so as to output thereafter, by use of a plurality of third adding means.

The resampler circuit according to the second aspect of the present invention is constructed such that it comprises: a plurality of registers connected in series, each of which stores, synchronizing with the clock signals, input data of time series obtained through sampling operation, and sequentially outputs the input data to the following stage, a plurality of adding means for adding input data stored in each of a plurality of paired registers, which paired registers being provided by dividing a plurality of registers into a former half and a latter half group, and positioned in such a manner that the first one of the former half group and the last one of the latter half group are paired with each other, and each of the plurality of adding means being provided as corresponding to each of the pair of registers, except the first one of the former half group and the last one of the latter half group, a first storage means for storing coefficients obtained by a SINC function during the time period between the reference time corresponding to a center tap of the SINC function and a first time point which is after a time lapse of sampling interval −T, a second storage means for storing coefficients obtained by the SINC function during the time period between the reference time and second time point which is after a time lapse of sampling interval −T, a plurality of third storage means for storing coefficients obtained by the SINC function at the sampling intervals −T counting from the second time point, a first multiplying means for multiplying the data output from the first register of the latter half group in the plurality of registers by the coefficients obtained from the first storage means, a second multiplying means for multiplying the data output from the last register of the former half group in the plurality of registers by the coefficients obtained from the second storage means, a plurality of third multiplying means for multiplying the data output from each of the plurality of first adding means by the coefficients obtained form each of the plurality of third storage means corresponding to each of the plurality of first adding means, a second adding means for adding the data output from the first multiplying means by the data output from the second multiplying means, and a plurality of third adding means for sequentially adding the result of addition output from the second adding means and the output data from each of the plurality of third multiplying means, and outputting thereafter, each of which third adding means corresponding to each of the third multiplying means and connected in series.

The resampler circuit according to the third aspect of the present invention is constructed in such a manner that it comprises: a plurality of registers connected in series, each of which stores, synchronizing with the clock signals, input data of time series obtained through sampling operation, and sequentially outputs the input data to the following stage, a first storage means for storing coefficients obtained by a SINC function during the time period between the reference time corresponding to a center tap of the SINC function and a first time point which is after a time lapse of sampling interval −T, a second storage means for storing coefficients obtained by the SINC function during the time period between the reference time and second time point which is after a time lapse of the sampling interval −T, a plurality of fourth storage means for storing the coefficients obtained by the SINC function corresponding to a half of the time width of each of the sampling intervals T counting from the first time point and the coefficients obtained by the SINC function corresponding to a half of the time width of each of sampling intervals −T counting from the second time point, a first multiplying means for multiplying the data output from the last register of a former half group of the two groups obtained by dividing the plurality of registers mutually connected in series by the coefficients obtained from the first storage means, a second multiplying means for multiplying the data output from the first register of a latter half group of the two groups by the coefficients obtained from the second storage means, a plurality of fourth multiplying means for multiplying the coefficients obtained from each of the plurality of fourth storage means by the data output from each of the plurality of registers corresponding to each of the fourth storage means, and a plurality of adding means connected in series for sequentially adding up the data from each of the fourth multiplying means, the first multiplying means and the second multiplying means.

The resampler circuit according to the fourth aspect of the present invention is constructed in such a manner that it comprises a plurality of registers connected in series, each of which stores, synchronizing with the clock signals, input data of time series obtained through sampling operation, and sequentially outputs the input data to the following stage, a plurality of adding means for adding input data stored in each of a plurality of paired registers, the paired registers being provided by dividing a plurality of registers into a former half and a latter half group, and positioned in such a manner that the first one of the former half group and the last one of the latter half group are paired with each other, and each of the plurality of adding means being provided as corresponding to each of the pair of registers, except the first one of the former half group and the last one of the latter half group, a first storage means for storing coefficients obtained by a SINC function during the time period between the reference time corresponding to a center tap of the SINC function and a first time point which is after a time lapse of sampling interval T, a second storage means for storing the coefficients obtained by the SINC function during the time period between the reference time and second time point which is after a time lapse of sampling interval −T, a plurality of fourth storage means for storing the coefficients obtained by the SINC function corresponding to a half of the time width of each of the sampling intervals −T starting from the second time point, a first multiplying means for multiplying the data output from the first register of the latter half group in the plurality of registers by the coefficients obtained from the first storage means, a second multiplying means for multiplying the data output from the last register of the former half group in the plurality of registers by the coefficients obtained from the second storage means, a plurality of third multiplying means for multiplying the data output from each of the plurality of first adding means by the coefficients obtained form each of the plurality of fourth storage means corresponding to each of the plurality of first adding means, a second adding means for adding the data output from the first multiplying means by the data output from the second multiplying means, and a plurality of third adding means for sequentially adding the result of addition output from the second adding means and the output data from each of the plurality of third multiplying means and outputting thereafter, each of the third adding means corresponding to each of the third multiplying means and connected in series.

The resampler circuit according to another aspect of the present invention is constructed in such a manner that each of the plurality of fourth storage means is provided with an inverting means for inverting the input address data indicating a specific storage area storing the coefficients, and a selecting means for selecting either the output from the inverting means or the input address data, and outputs the coefficient from the storage area connected to word lines corresponding to the number of bits of the address data output from the selecting means.

The resampler circuit according to another aspect of the present invention is constructed in such a manner that one part of the plurality of fourth storage means takes in the input address data by way of address lines corresponding to the upper n−1 bits (wherein n denotes the total number of bits) of the input address data, and output the coefficient stored in said storage area on the basis of said input address data.

DETAILED DESCRIPTION OF THE PREFERRED EMBODIMENTS

Several embodiments of the present invention are now explained as in the followings.

[First Embodiment]

Figure 1:
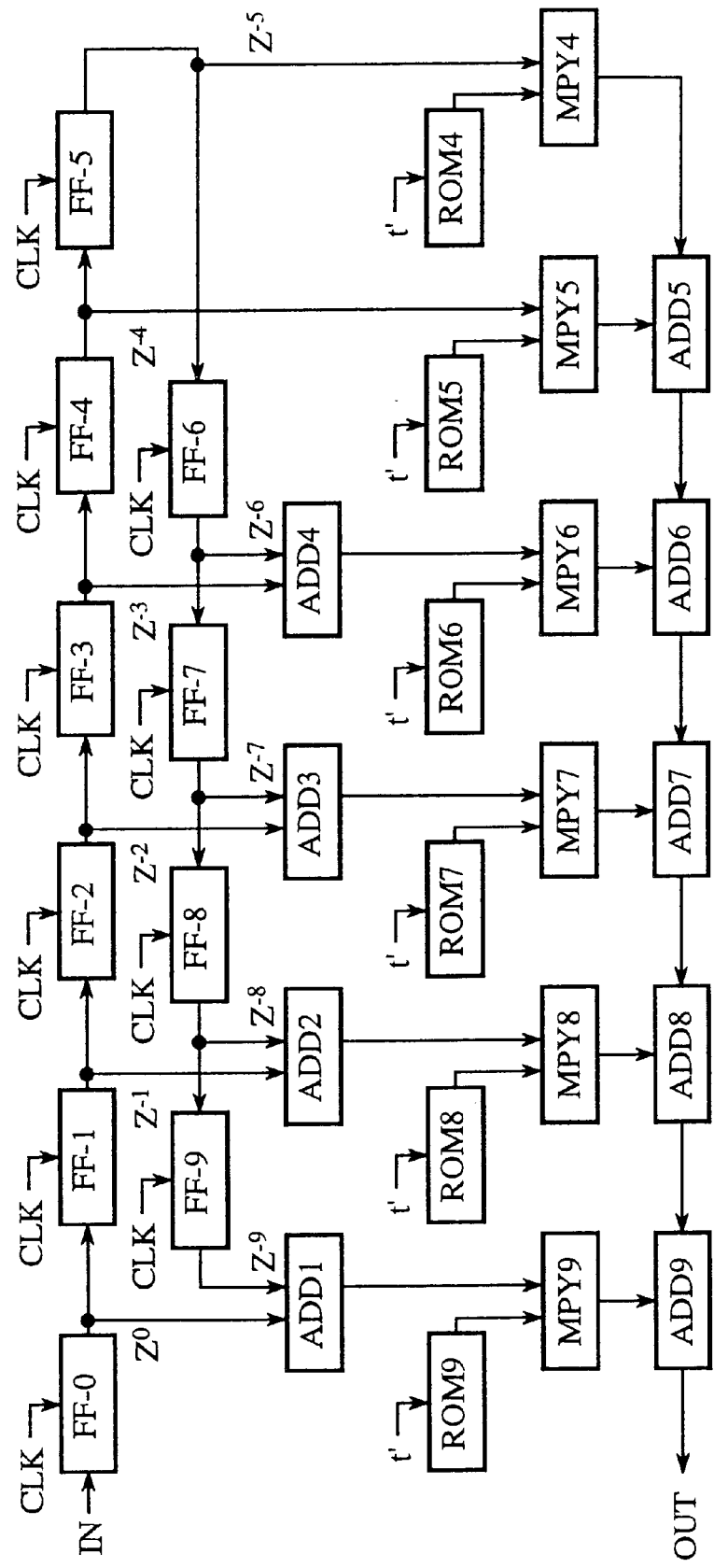
FIG. 1 is a block diagram showing the configuration of a resampler circuit according to the first embodiment of the present invention.
Figure 3:
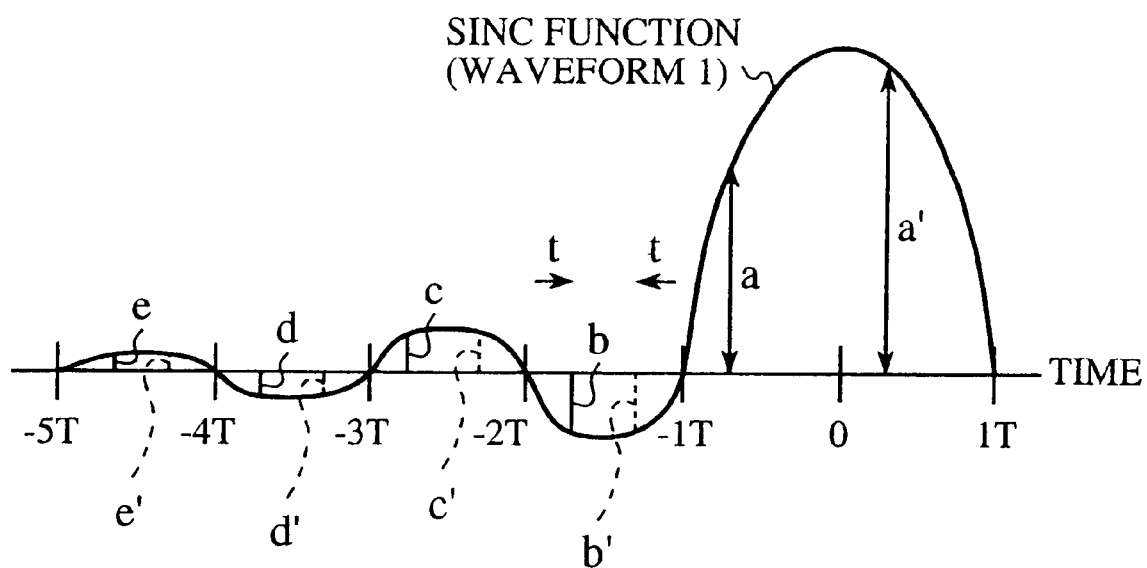
FIG. 3 is an exemplary view showing coefficients to be stored in each of the ROMs adopted in the resampler circuit of the first embodiment shown in FIG. 1.

FIG. 1 is a block diagram showing a resampler circuit, or a FIR filter according to the first embodiment of the present invention. In the figure, FF-x is a collective form of FF-0 to FF-9, and each one denotes a register, such as a shift register for example. ADDx is a collective form of ADD0 to ADD9, and each denotes an adder, wherein ADD1 to ADD4 are a plurality of first adder means, ADD5 is a second adder means, and ADD6 to ADD9 are a plurality of third adder means. MPYx is a collective form of MPY4 to MPY9, and each denotes a multiplier, wherein MPY4 is a plurality of first multiplier means, MPY5 is a second multiplier means, and MPY6 to MPY9 are a plurality of third multiplier means. ROM4 is a Read Only Memory (first storage means), ROM5 is a Read Only Memory (second storage means), and ROM6 to ROM9 are all Read Only Memories (a plurality of third storage means). In these ROM4 to ROM9, the coefficients indicated by the SINC function as shown in FIG. 3 are stored. Further, IN denotes an input digital data to be sampled, and OUT denotes an output digital data to which a timing recover has already applied.

Figure 2:
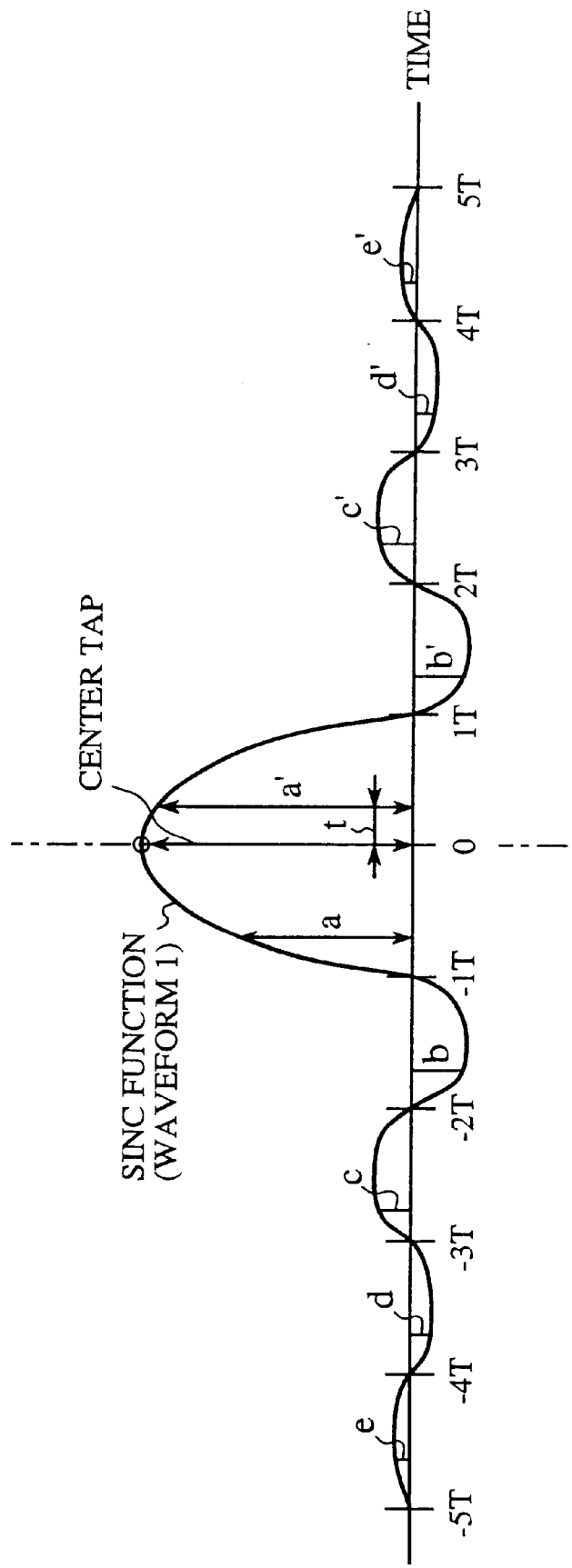
FIG. 2 is an exemplary view showing a waveform indicating a SYNC function.

FIG. 2 is an exemplary view showing a waveform 1 of the SINC function, and FIG. 3 is an exemplary view showing the coefficients stored in each ROM in the resampler circuit of the first embodiment shown in FIG. 1. In theses figures, the time point 0 is a reference time corresponding to the center tap of the SINC function, wherein 1T denotes a time point (first time point) at which the sampling interval T has elapsed from the time point 0 corresponding to the center tap of the SINC function, namely the reference time point 0. Further, −1T denotes a time point (second time point) at which the sampling interval −T has elapsed from the reference time 0. Here, the direction in which the number of T increments indicates the older side, whereas the direction in which the number of −T increments indicates the later side.

The ROM4 in FIG. 1 is a ROM that stores coefficients within the time interval between 0 and T (hereinafter referred to just as [0, T], and similar cases are abbreviated in the same manner) in the waveform 1 indicated by the SINC function shown in FIG. 3, and the time interval [0, T] is divided into, for example, 128 time points, and the coefficients of the SINC function each corresponding to each of the divided time points are stored in the ROM4.

ROM5 is a ROM that stores coefficients within the time interval [0, −T] in the waveform 1 indicated by the SINC function shown in FIG. 3, and is divided into 128 time points, just like the ROM 4, and the coefficients of the SINC function each corresponding to each of the divided time points are stored in the ROM 5.

Each of the ROM6 to ROM9 stores the coefficients within each of the time intervals [−T, −2T], [−2T, −3T], [−3T, −4T] and [−4T, −5T] in the waveform indicated by the SINC function shown in FIG. 3, wherein each of the time intervals is divided into 128 time points, just as the cases of the ROM4 and ROM5, and each one stores the coefficients in the waveform 1 of the SINC function corresponding to each of the thus divided time points. Although four ROMs, namely ROM 6 to ROM 9, are used in this embodiment, the present invention is not limited to this, and in fact, the time intervals T between adjacent sampling time points can be made longer or shorter, depending on the utility of the circuit, and in this case, the number of ROMs to be used also changes correspondingly.

The operation of the digital timing recovery circuit, or resampler circuit of the present embodiment is now explained as follows.

First of all, algorithm implemented in this resampler circuit according to the present embodiment is explained with reference to FIG. 2.

The waveform 1 indicated by the SINC function shown in FIG. 2 has coefficients which are substantially symmetrical about the time point 0 (reference time), except the time intervals between the time points 0 and T, and 0 and −T. For example, when the coefficients at the time points, which are shifted for a predetermined time period "t'" from each of the time points 1T, 2T, 3T and 4T, are moved to the position symmetrical about the time 0 (namely the left half portion of FIG. 2 from the time point 0), then these coefficients will become the data respectively indicated by dotted lines b', c', d' and e'.

Further, observing the coefficients of the waveform 1 within the time interval [−4T, −5T], it can be deduced that the coefficients, for example the coefficients e and e', are substantially equal to such an extent that they are almost symmetrical about the timing −4.5T which is the center point of the time interval [−4T, −5T]. In the same way, within the time interval [−3T, −4T], the coefficients d and d', which are almost symmetrical about the timing −3.5T, are substantially equal, and within the time interval [−2T, −3T], the coefficients c and c' almost symmetrical about the timing −2.5T are substantially equal. Further, within the time interval [−1T, −2T], the coefficients b and b' almost symmetrical about the timing −1.5T are substantially equal. In other words, there exist relationships such as b≈b', c≈c', d≈d' and e≈e'.

As a matter fact, when comparing the relation of e≈e' with d≈d', error in the latter is smaller. However, considering the above relation, the before-explained formula (4) can be replaced with the following formula (5).

$$((Z^0 + Z^{-9}) \cdot e + ((Z^{-1} + Z^{-8}) \cdot d) + ((Z^{-2} + Z^{-7}) \cdot c) + ((Z^{-3} + Z^{-6}) \cdot b) + (Z^{-4} \cdot a) + (Z^{-5} \cdot a') \quad (5)$$

Figure 12:
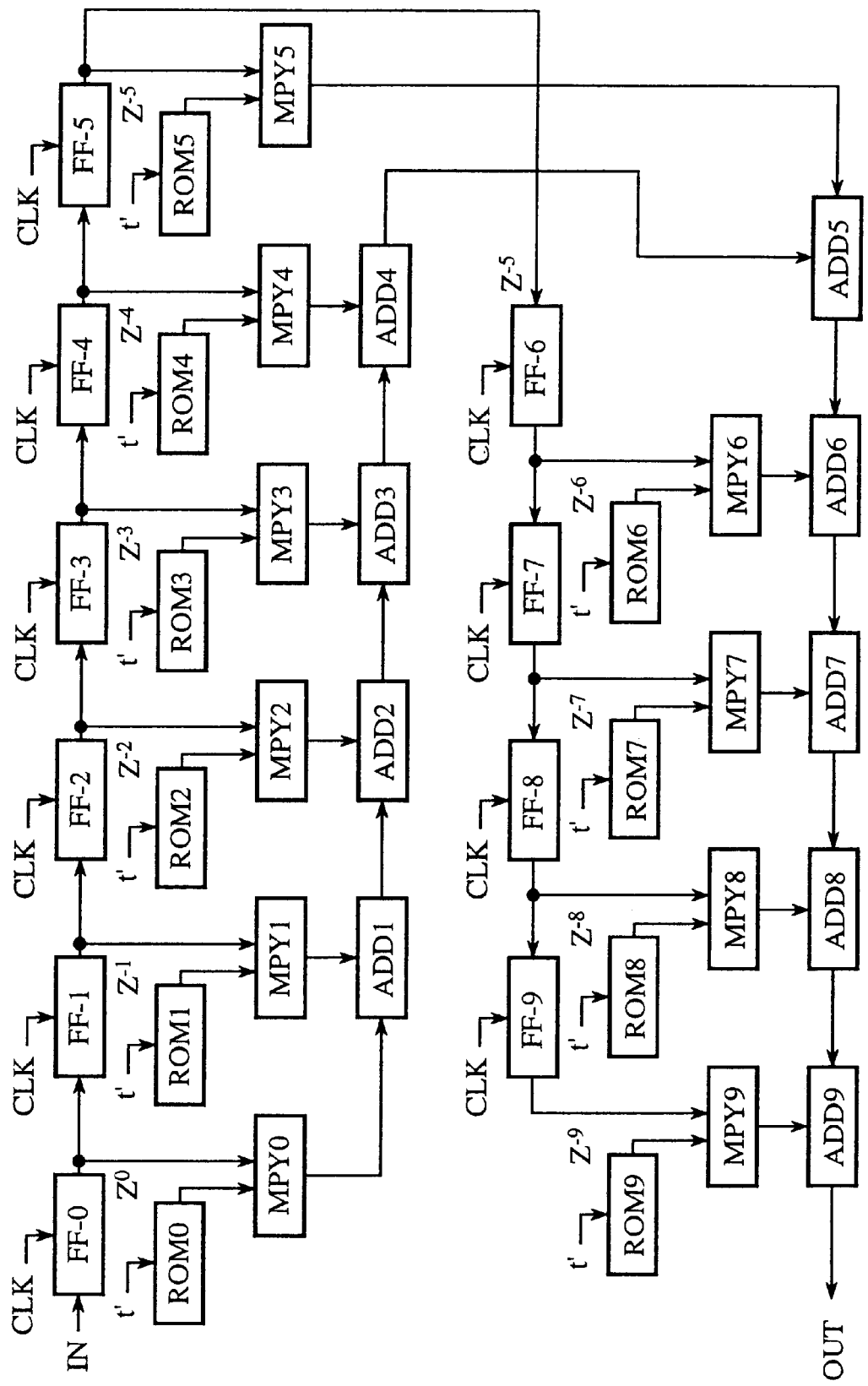
FIG. 12 is an exemplary view showing the conventional resampler circuit.

For this reason, as shown in the formula (4), 10 times of multiplication and 9 times of addition required in the conventional resampler circuit shown in FIG. 12 can be reduced to only 6 times of multiplication and 9 times of addition as shown by formula (5) and FIG. 1. In other words, since the number of multipliers and that of ROMs storing the coefficients therein can be reduced in the resampler circuit of the first embodiment, a resampler circuit having the hardware of a minimized scale can be provided. Further, since the number of multipliers is reduced, the operation speed as a whole can be raised.

Normally, since a multiplier requires a longer time for its operation in proportion to the number of data bits than the time an adder requires, and since the hardware scale thereof is larger than that of the adder, the fact that the required number of multiplication has been reduced from 10 to 6, namely to approximately a half the previous example, greatly contributes to the reduction of operation speed and the hardware scale thereof.

In the resampler circuit of the first embodiment as shown in FIG. 1, the time interval [0, T] shown in FIG. 2 or FIG. 3 is divided into 128 time points, and the coefficients indicated by the SINC function corresponding to the thus divided time points are stored in the ROM4. In the same way, the time interval [0, −T] is divided into 128 time points, and the coefficients indicated by the SINC function corresponding to the thus divided time points are stored in the ROM5. Further, each of the time intervals respectively shown by [−T, −2T], [−2T, −3T], [−3T, −4T], [−4T, −5T], of the waveform indicated by the SINC function shown in FIG. 2 or FIG. 3 is divided into 128 time points, and the coefficients corresponding to each of the thus divided time points are stored in the respective ROMs, namely the ROM6 to ROM9.

In the first embodiment as described above, each of the time intervals is divided into 128 time points, and the coefficients each corresponding to each of the thus divided time points are stored in ROM. However, the number of division is not limited to 128, and in fact, the time interval can be divided into 256 or other than this number. Further, the storage means for storing the coefficients is not limited to ROMs, but can be RAMs. Still further, multipliers and adders can be of any type, as long as they can perform their respective arithmetic functions correctly.

All this above is not limited to those used in this embodiment, but can be applied to all the following embodiments.

As explained above, according to the first embodiment, in the waveform 1 obtained by the SINC function that indicates an impulse response, since it is arranged such that the coefficients are stored in the ROMs considering the symmetrical characteristic of the waveform 1 except the time intervals from the reference time 0 corresponding to the center tap to the time point T, and also to the time point –T, respectively [0, T], [0, –T], the number of multipliers and ROMs can be reduced, and the number of arithmetic operations can also be reduced, whereby a resampler circuit which has minimized the hardware scale thereof, yet capable of high-speed arithmetic operation can be provided.

(Second Embodiment)

Figure 4:
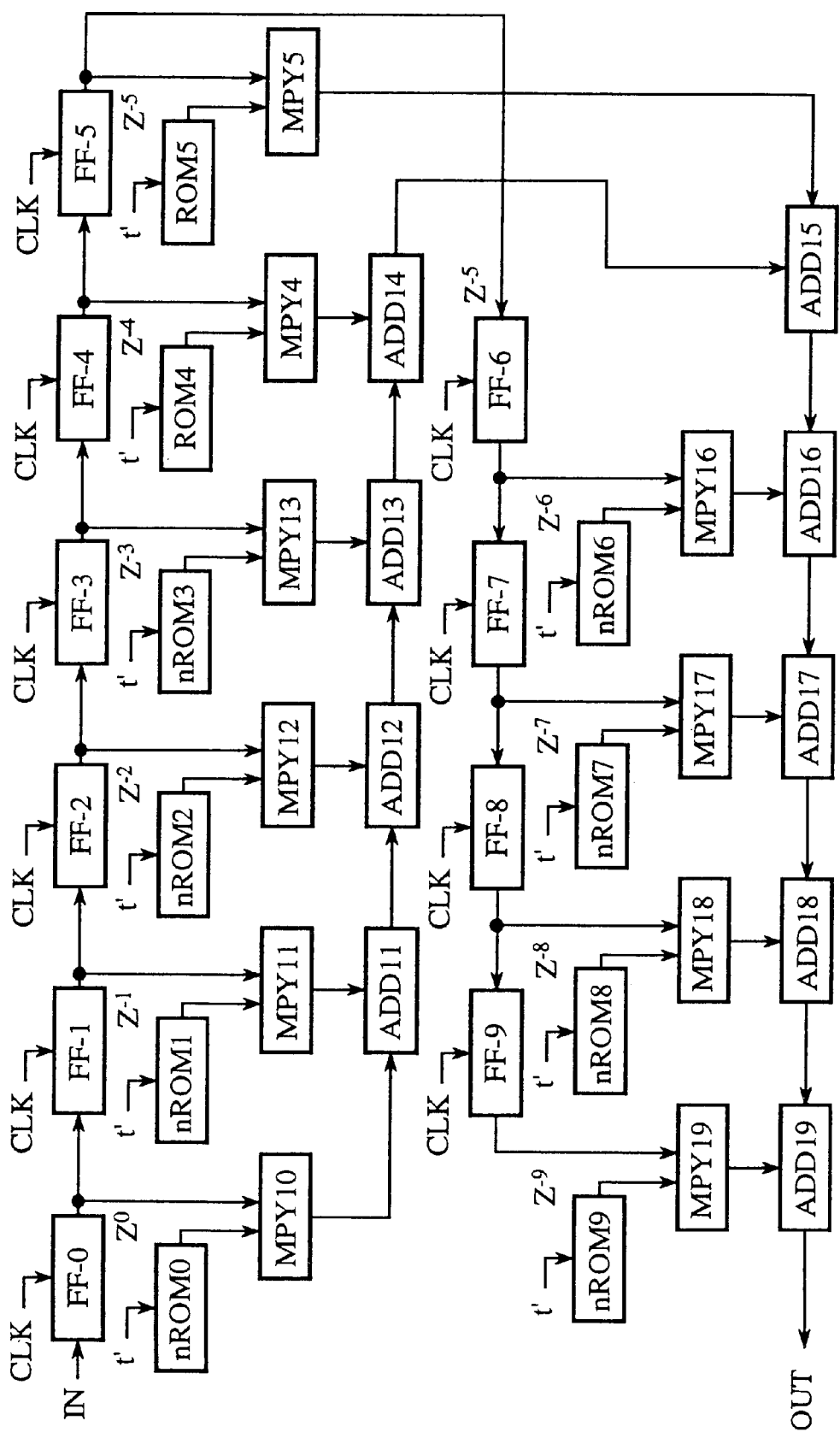
FIG. 4 is a block diagram showing the configuration of a resampler circuit according to the second embodiment of the present invention.

FIG. 4 is a block diagram showing a resampler circuit, or a FIR filter according to the second embodiment of the present invention. In the figure, FF-x is a collective form of registers FF0 to FF9 (a plurality of registers), ADDx is a collective form of adders ADD11 to ADD19 (a plurality of address), MPYx is a collective form of multipliers MPY4 (first multiplier means), MPY5 (second multiplier means), MPY10 to MPY13, and MPY16 to MPY19 (a plurality of fourth multipliers), and nROMx is a collective form of a Read Only Memories ROM0 to ROM3, and ROM6 to ROM9 (a plurality of fourth storage means) for storing the coefficients obtained by the SINC function indicating an impulse response shown in FIG. 2.

Further, IN denotes a digital data to be sampled, and OUT denotes an output digital data to which a timing recovery has already applied. It is to be noted that the ROM4 and ROM5 are same as those used in the first embodiment. That is, the ROM4 (first storage means) stores the coefficient obtained by the waveform 1 within the time interval [0, T] indicated by the SINC function shown in FIG. 2, whereas the ROM 5 (second storage means) stores the coefficient obtained by the waveform 1 within the time interval [0, –T].

The operation of the digital timing recovery circuit or a resampler circuit of the second embodiment is now explained as follows.

As explained in the first embodiment, in the waveform 1 indicated by the SINC function shown in FIG. 2, the coefficients in the time intervals [–5T, –4T], [–4T, –3T], [–3T, –2T], [–2T, –1T], [T, 2T], [2T, 3T], [3T, 4T], and [4T, 5T] are substantially symmetrical in the lateral direction about the center time point of the respective time intervals. For example, in the time interval [3T, 4T], the coefficient of the waveform at the time point 3.2T(+0.2T) and that at the time point 3.8T(=3T+0.8T) are close values to each other. Similarly, the coefficient of the waveform 1 at the time point –4.35T (=–4T–0.35T) and that at the time point –4.65T (=–5T +0.35T) are close values to each other.

In other words, the coefficient of the waveform 1 at the time point T+t' is close to the coefficient of the waveform 1 at the time point (T+1)–t', whereas the coefficient of the waveform 1 at the time point T–t' is close to the coefficient of the waveform 1 at the time point (T–1)+t'.

For this reason, on the basis of the above characteristic, as to the coefficients stored in each of the ROMs, the coefficient of the first half and those of the latter half from the center time point within each of the time intervals can be regarded as being an approximation. That is, in each of the ROMx (x=0 to 3, and 6 to 9), if the coefficients of the first half from the center address are stored, the coefficients of the latter half are not necessarily be stored. In other words, the data to be stored in each of the ROMs will be only a half the coefficients corresponding to each of the time intervals. Due to this, the storage capacity of each ROM can be minimized, that is, the resampler circuit can be configured by the ROMs of small size.

About the waveform 1 shown in FIG. 2, for example, in a case that the time interval [T, 2T] is divided into 128 time points, although 0 to 127 can be input to indicate the address within each nROMx (x=0 to 3, and 6 to 9), the coefficients to be stored will require only a half the 128 time points, namely address 0 to 63. In this case, even when the address 64 to 127 are input, the coefficients stored in the address 63 to 0 are read and output.

In each of the nROMx (x=0 to 3, and 6 to 9) in the resampler circuit of the second embodiment as shown in FIG. 4, since it is sufficient if a half the coefficients in each of the time intervals [–T, –2T], [–2T, –3T], [–3T, –4T], [–4T, –5T], [T, 2T], [2T, 3T], [3T, 4T], and [4T, 5T] is stored, the hardware scale thereof can be minimized.

Figure 5:
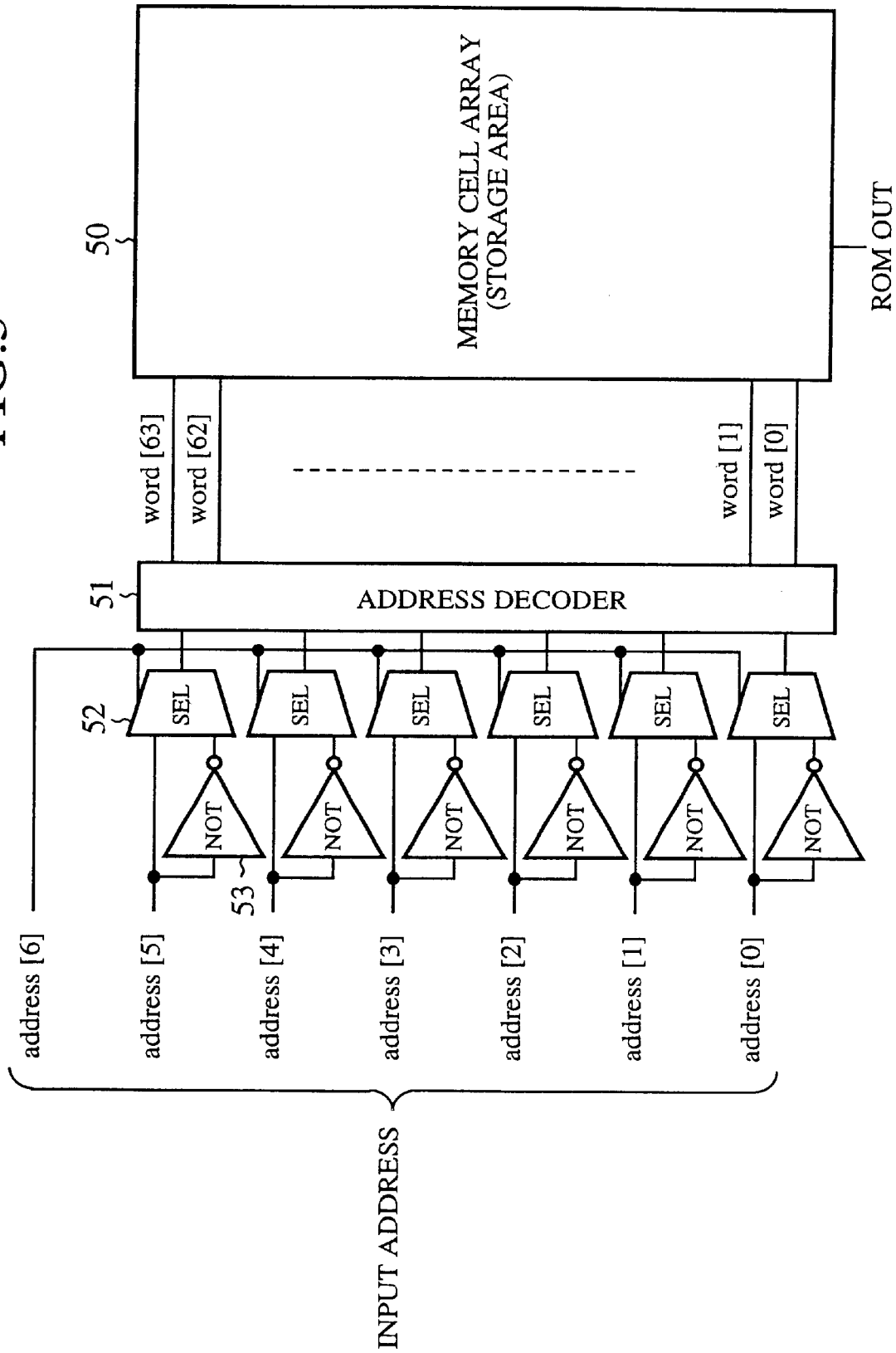
FIG. 5 is a block diagram showing a ROM adopted in the resampler circuit of the second embodiment.

FIG. 5 is a block diagram showing the configuration of each of the ROMs in the resampler circuit of the second embodiment shown in FIG. 4. In the figure, reference numeral 50 denotes a memory cell array, numeral 51 denotes a plurality of address decoders for decoding an input address, numeral 52 denotes a selector (selecting means), and numeral 53 denotes a plurality of NOT circuits (inverting means). The memory cell array 50 and the address decoder 51 are connected to each other by word lines, namely word line [0] to word line [63].

The address decoder 51 is a circuit, which first decodes an input binary address data, and sets only one of the word lines to logic "H", with all the rest of word lines being set to logic "L". By this procedure, the output data ROMOUT from the memory cell array 50 becomes the output signal from the ROM, and the output data ROMOUT contains the same bit width as that of the memory cell array 50. The SEL 52 denotes a selecting means, namely a selector, and the NOT circuit 53 is a signal inverting circuit. The address lines [0] to [6] are input address lines of the ROM, forming 7-bit width for enabling to specify the address 0 to 127.

The ROM in the conventional resampler circuit shown in FIG. 12 is arranged such that the address signal fed through the address lines [0] to [6] is directly taken into the address decoder 51, one of the word lines word [0] to [127] corresponding to 0 to 127 indicated in a binary form becomes logic "H", and thereafter the data within the memory cell array 50 connected to that word line is externally output as an output data ROMOUT.

Contrary to this, the nROMx (x=0 to 3, and 6 to 9) within the resampler circuit of the second embodiment is arranged such that the address line [6] is connected to the selector 52, and the signal fed through the address lines [5] to [0] can be input either to the address decoder as it is, or in an inverted manner. That is, if the signal of the address lines [6] is "0", the signal of each of the address lines [5] to [0] is input to the address decoder 51 as it is, whereas if the signal of the address line [6] is "1", the signal of the address lines [5] to [0] is inverted, that is, either from "1" to "0", or from "0" to "1" depending on the previous signal state, before being input to the address decoder 51.

In the ROM installed in the conventional resampler circuit as shown in FIG. 12, if there are provided 7 bits for the external input address, all these 7 bits are input to the address decoder, so that 128 word lines are required in total. Contrary to this, in the nROMx (x=0 to 3, and 6 to 9) within the resampler circuit of the present embodiment, even if there are provided 7 bits for the external input address as the case of the conventional example, the address data to be input to the address decoder 51 is of 6 bits. Therefore, it suffices if there are 64 word lines for transmitting the decoded result output from the address decoder 51 to the memory cell array 50, and thus the configuration of the ROM is made simple. Further, the externally input address data is first inverted at the center portion of the address data and input to the memory cell array 50 thereafter, so that the data size of the coefficients stored in the memory cell array 50 will be half the conventional one, and the memory size can be thereby reduced.

As explained above, as to the coefficients to be stored in each of nROMx (x=0 to 3, and 6 to 9) according to this second embodiment, since the coefficients in the first half and those in the latter half within each of the time intervals can be regarded as being approximation, and only the coefficients of the first half portion from the center address of each nROMx are stored, the storage size of each of the nROMx can be made smaller, and thus, are sampler circuit having ROMs of small storage size can be provided. Further, since each of the nROMx is formed with selectors 53 for inverting the input address data, the required number of word lines becomes approximately half, and therefore a simple hardware structure of nROMx can be realized.

(Third Embodiment)

Figure 6:
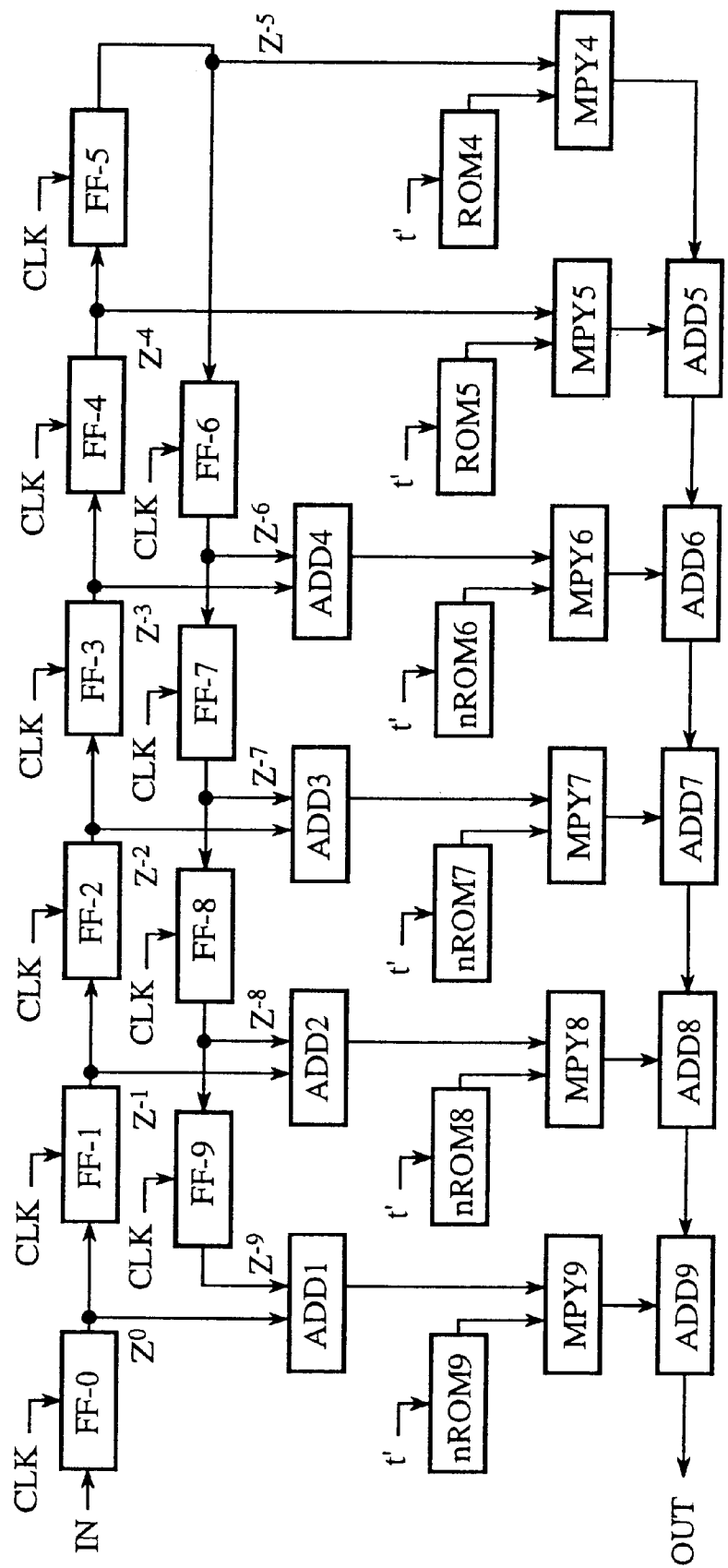
FIG. 6 is a block diagram showing the configuration of a resampler circuit according to the third embodiment of the present invention.
Figure 7:
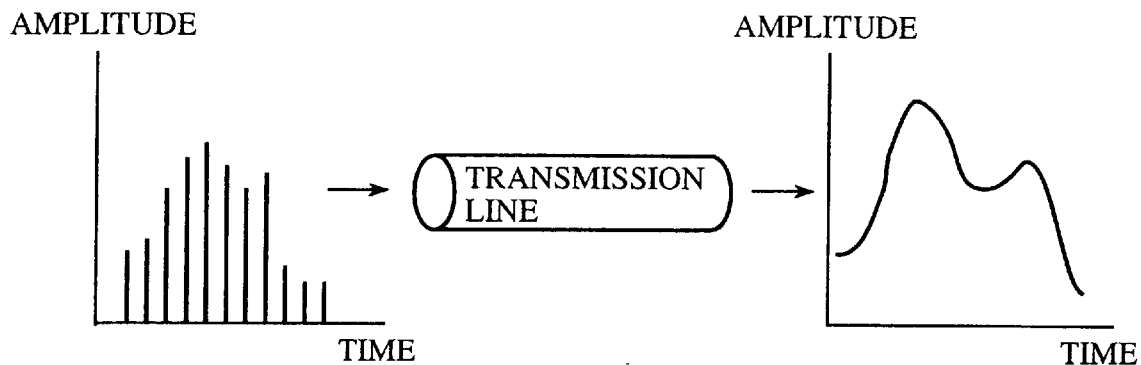
FIG. 7 is an exemplary view showing the relationship between a transmitted data and a received waveform in a digital transmission system.
Figure 8:
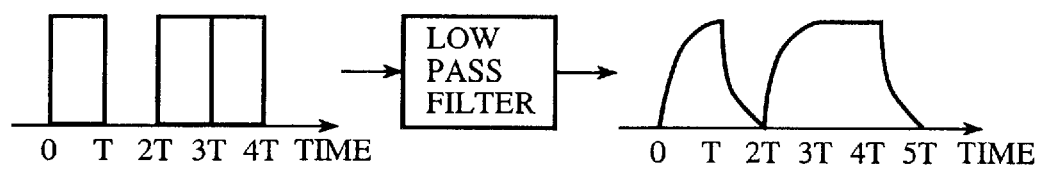
FIG. 8 is an exemplary view showing an intersymbol interference occurred in a digital data when the data is received by way of a low pass filter.
Figure 9:
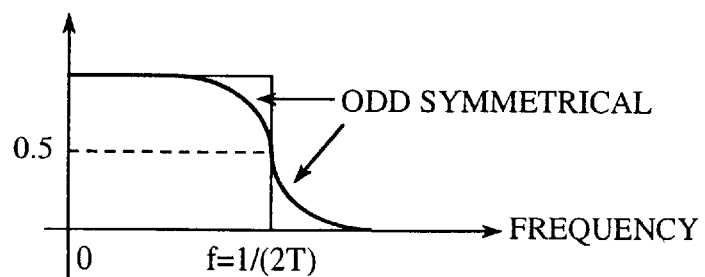
FIG. 9 is an exemplary view showing a filter characteristic in order to suppress occurrence of the intersymbol interference.
Figure 10:
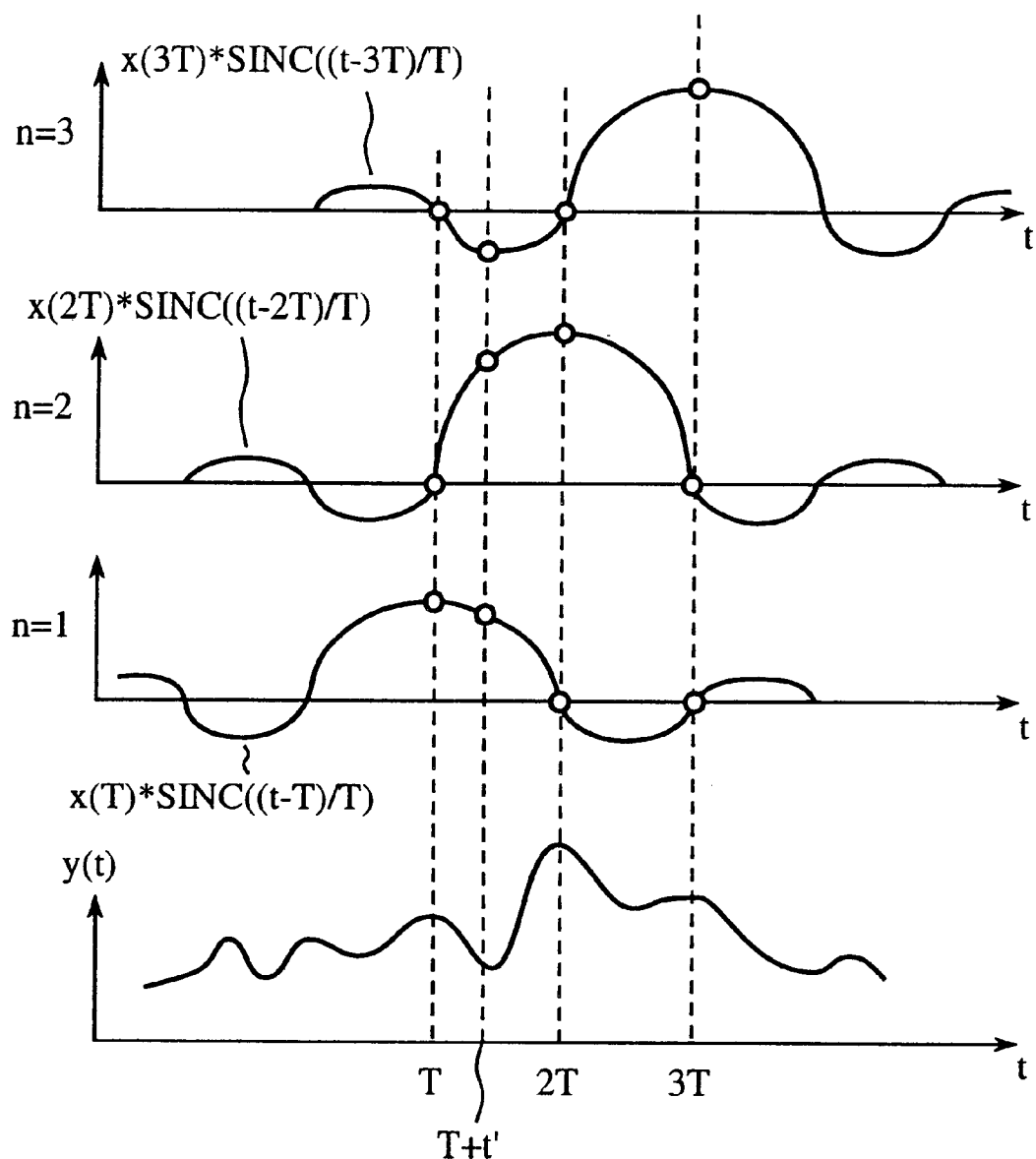
FIG. 10 is an exemplary view showing a calculation method of interpolation data in the resampler circuit.
Figure 11A:
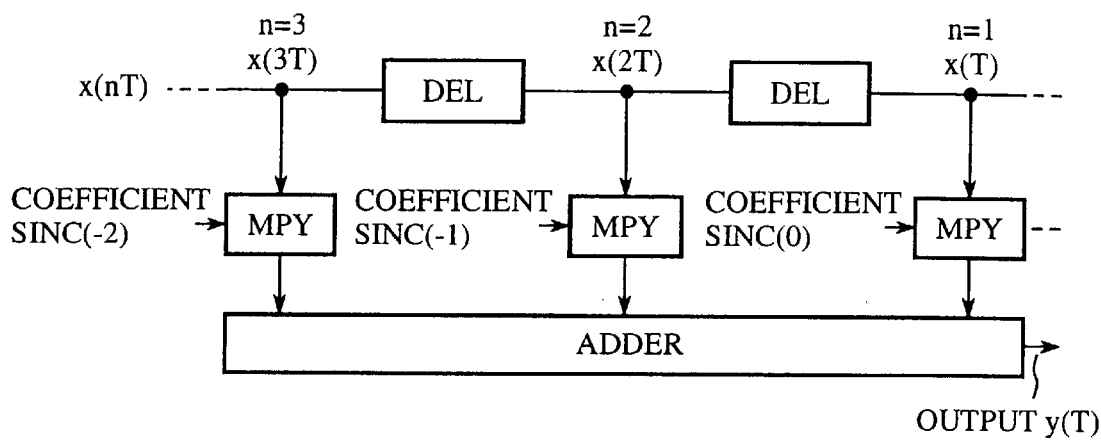
FIGS. 11A and 11B are exemplary view showing a calculation method of interpolation data in the conventional resampler circuit.
Figure 11B:
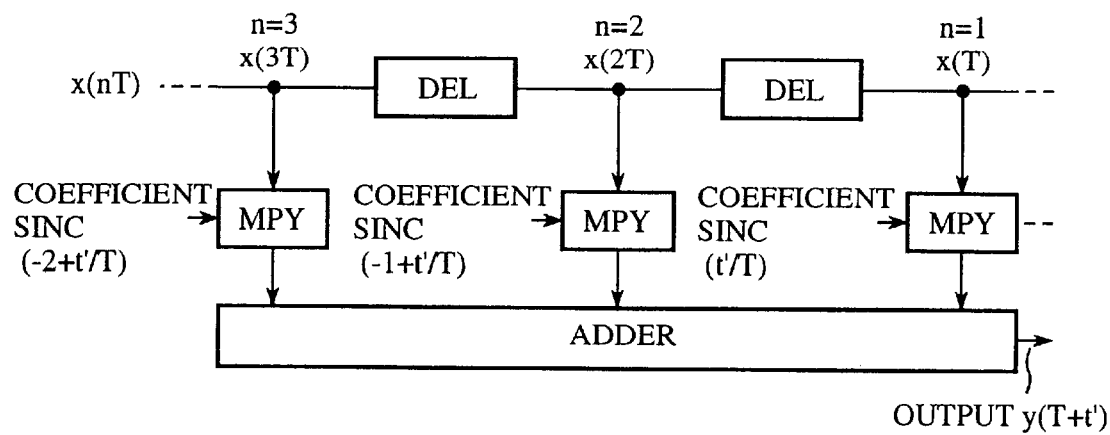

FIG. 6 is a block diagram showing a resampler circuit according to the third embodiment of the present invention. As shown in FIG. 6, the resampler circuit of the present embodiment is the one that the ROM6 to ROM9 in the resampler circuit of the first embodiment shown in FIG. 1 are replaced by the nROM6 to nROM9 of the resampler circuit of the second embodiment shown in FIG. 4. Other structural elements are same as those in the first embodiment, so that they are explained by the same reference numerals.

The operation of the digital timing recovery circuit or resampler circuit of the third embodiment is explained as shown below.

If the ROM6 to ROM9 in the resampler circuit of the first embodiment shown in FIG. 1 are replaced by the nROM6 to nROM9 of the resampler circuit of the second embodiment shown in FIGS. 4 and 5, the hardware size of these ROM 6 to ROM9 can be reduced, in addition to the structural advantage that the number of multipliers and ROMs, and also the number of multiplication can be reduced, so that a resampler circuit capable of performing a high-speed operation, yet with a simple structure can be provided.

(Fourth Embodiment)

It can be observed from the SINC function indicating the impulse response in FIG. 2 that the absolute value of the coefficients is getting smaller from the center toward the peripheral area, namely in the direction in which the number of T increments and that in which the number of -T increments, in accordance with the time lapse. In other words, when the time interval between adjacent sampling time points T is divided into 128 time points, even though the coefficient greatly varies when the time t' is shifted for one of the divided 128 time points within the time interval [0, T], it will not vary so much in case the same occurs in the time interval (4T, 5T].

For example, when the number of division is 128, there is not much difference in the coefficient between the case that the time period t' is shifted for one of the 128 time points and the case that the time period t' is shifted for 2 of the 128 time points within the time interval [4T, 5T]. Therefore, within the time interval [4T, 5T], it is not necessary to set the number of division to 128, and in fact 64 will do without causing any adverse effect.

To set the number of division within a time interval to a small number is equivalent to the reduction of number of addresses in the ROM required for storing the coefficients and it means that the storage size of the ROM that is the amount of hardware can be reduced.

Assuming that the minimum time interval in the case of 128 division is t', then the minimum time interval in the case of 64 division is t", which means that the value of each t' and t" differs from each other. However, in a case that the address is formed by 7 bits, and the time interval is divided into 128, then only by setting the address to indicate the time point t" by use of the upper 6 bits out of 7 bits required for indicating the time period t', division into 64 time points is made possible, so that neither modification of the hardware configuration in accordance with the changing of minimum time interval (number of division), nor magnification of the hardware scale is required.

As explained hereinabove, according to the fourth embodiment of the present invention, on the basis of the fact that the absolute value of the coefficient is getting smaller from the center (reference time 0) of the SINC function indicating the impulse response toward the peripheral area, namely in the direction in which the number of T increments and that in which the number of -T increments, in other words, due to the fact that for example within the time interval [4T, 5T], even when the time period t' is shifted for one of the 128 time points, variation of the coefficients is very narrow, the address is so arranged as to specify the time point t" by use of the upper 6 bits out of the 7 bits of the address lines required for specifying the time point t', so that the number of bits for specifying input address can be reduced. In this case, although the minimum time interval (number of division) within the time interval is changed, there is no need to modify the hardware configuration, and no fear of increase in the size and so on is generated.

As explained heretofore, according to the present invention, since it is arranged such that the coefficients are stored in the ROM in consideration of the symmetrical characteristic of the waveform (namely the coefficient) except the time intervals [-T, 0] an [0, T] of the waveform acquired by the SINC function indicating the impulse response, the number of multipliers, ROMs and so on can be reduced, and the number of arithmetic operations can be reduced, so that a resampler circuit having a minimized hardware scale, yet capable of high-speed arithmetic operation can be provided.

According to the present invention, since for example it is arranged such that the coefficients in the only first half portion from the center address are stored in each ROM in consideration of the symmetrical characteristic of the waveform, that is, in consideration of the characteristic of the coefficients in the first half and those in the second half about the center time point within each of the time intervals, except the time intervals [-T, 0] an [0, T] in the waveform acquired by the SINC function indicating the impulse response, the size of each of the ROMs can be minimized, and the size of the hardware of the resampler circuit can also be reduced.

According to the present invention, since it is arranged such that each, of the ROMs is, taking advantage of the symmetrical characteristic of the waveform within each of the time intervals of the SINC function indicating the impulse response, provided with a selector that inverts an input address data to be input thereto and the word lines, the number of which has been reduced to a half for reading the coefficients stored in the storage area therein, the size of each ROM can be reduced, and the size of the hardware of the resampler circuit can also be reduced.

Still further, according to the present invention, since it is arranged such that on the basis of the fact that the absolute value of the coefficient is getting smaller as the time elapses in the direction from the center (reference time 0) of the SINC function indicating the impulse response toward the peripheral area, namely in the direction in which the number of T is incremented and that in which the number of −T is incremented, the coefficients stored in each ROM are read out by use of the address lines whose bit number required for specifying the coefficients is reduced, so that the size of the ROMS can be reduced, and as a result, the hardware scale there of in the resampler circuit can be reduced.

What is claimed is:

1. A resampling method comprising the steps of:

in a state that a plurality of registers storing input data of time series obtained through sampling operation are divided into a former half group and a latter half group, and positioned in such a manner that the first one of the former group and the last one of the latter group are paired with each other, adding said input data stored in each of said paired registers except the first one of the former group and the last one of the latter group by use of a plurality of first adding means, multiplying the data output from the first register of said latter half group in said plurality of registers by the coefficients obtained from a first storage means storing the coefficients obtained by a SINC function during the time period between a reference time corresponding to a center tap of the SINC function and a first time point which is after a lapse of sampling interval T by use of a first multiplying means, multiplying the data output from the last register of said former half group within said plurality of registers by the coefficients obtained from a second storage means storing the coefficients obtained by said SINC function during the time period between said reference time and a second time point after a lapse of sampling interval −T by use of a second multiplying means, adding the data output from each of said plurality of first adding means and the coefficients obtained from each of a plurality of third storage means storing the coefficients obtained by said SINC function at time intervals −T from said second time point by use of a plurality of third multiplying means each corresponding to each of said plurality of third storage means, adding the data output from said first multiplying means and the data output from said second multiplying means by use of a second adding means, and sequentially adding the result of addition output from said second adding means and the output from each of said plurality of third multiplying means, so as to output thereafter, by use of a plurality of third adding means.

2. A resampler circuit comprising:

a plurality of registers connected in series, each of which stores, synchronizing with the clock signals, input data of time series obtained through sampling operation, and sequentially outputs said input data to the following stage, a plurality of adding means for adding input data stored in each of a plurality of paired registers, said paired registers being provided by dividing a plurality of registers into a former half and a latter half group, and positioned in such a manner that the first one of the former half group and the last one of the latter half group are paired with each other, and each of said plurality of adding means being provided as corresponding to each of said pair of registers, except the first one of the former half group and the last one of the latter half group, a first storage means for storing coefficients obtained by a SINC function during the time period between the reference time corresponding to a center tap of the SINC function and a first time point which is after a time lapse of sampling interval T, a second storage means for storing coefficients obtained by the SINC function during the time period between the reference time and second time point which is after a time lapse of sampling interval −T, a plurality of third storage means for storing coefficients obtained by the SINC function at said sampling intervals −T counting from said second time point, a first multiplying means for multiplying the data output from the first register of said latter half group in the plurality of registers by the coefficients obtained from said first storage means, a second multiplying means for multiplying the data output from the last register of said former half group in the plurality of registers by the coefficients obtained from said second storage means, a plurality of third multiplying means for multiplying the data output from each of said plurality of first adding means by the coefficients obtained form each of said plurality of third storage means corresponding to each of said plurality of first adding means, a second adding means for adding the data output from said first multiplying means by the data output from said second multiplying means, and a plurality of third adding means for sequentially adding the result of addition output from said second adding means and the output data from each of said plurality of third multiplying means, and outputting thereafter, each of said third adding means corresponding to each of said third multiplying means and connected in series.

3. A resampler circuit according to claim 2, wherein a plurality of fourth storage means for storing coefficients obtained by the SINC function corresponding to a half of the time width of each of the sampling intervals −T counting from said second time point are replaced for a plurality of third storage means for storing coefficients obtained by the SINC function at said sampling intervals −T counting from said second time point.

4. A resampler circuit according to claim 3, wherein each of said plurality of fourth storage means is provided with an inverting means for inverting the input address data indicating a specific storage area storing the coefficients, and a selecting means for selecting either the output from said inverting means or the input address data, and outputs the coefficient from said storage area connected to word lines corresponding to the number of bits of the address data output from said selecting means.

5. A resampler circuit according to claim 3, wherein one part of said plurality of fourth storage means takes in said input address data by way of address lines corresponding to the upper n−1 bits (wherein n denotes the total number of bits) of said input address data, and output the coefficient stored in said storage area on the basis of said input address data.

6. A resampler circuit comprising:

a plurality of registers connected in series, each of which stores, synchronizing with the clock signals, input data of time series obtained through sampling operation, and sequentially outputs said input data to the following stage, a first storage means for storing coefficients obtained by a SINC function during the time period between the reference time corresponding to a center tap of the SINC function and a first time point which is after a time lapse of sampling interval T, a second storage means for storing coefficients obtained by the SINC function during the time period between the reference time and second time point which is after a time lapse of sampling interval −T, a plurality of fourth storage means for storing the coefficients obtained by said SINC function corresponding to a half of the time width of each of the sampling intervals T counting from said first time point and the coefficients obtained by the SINC function corresponding to a half of the time width of each of the sampling intervals −T counting from said second time point, a first multiplying means for multiplying the data output from the last register of a former half group of the two groups obtained by dividing said plurality of registers mutually connected in series by the coefficients obtained from said first storage means, a second multiplying means for multiplying the data output from the first register of a latter half group of said two groups by the coefficients obtained from said second storage means, a plurality of fourth multiplying means for multiplying the coefficients obtained from each of said plurality of fourth storage means by the data output from each of said plurality of registers corresponding to each of said fourth storage means, and a plurality of adding means connected in series for sequentially adding up the data from each of said fourth multiplying means, said first multiplying means and said second multiplying means.

7. A resampler circuit according to claim 6, wherein each of said plurality of fourth storage means is provided with an inverting means for inverting the input address data indicating a specific storage area storing the coefficients, and a selecting means for selecting either the output from said inverting means or the input address data, and outputs the coefficient from said storage area connected to word lines corresponding to the number of bits of the address data output from said selecting means.

8. A resampler circuit according to claim 3, wherein one part of said plurality of fourth storage means takes in said input address data by way of address lines corresponding to the upper n−1 bits (wherein n denotes the total number of bits) of said input address data, and output the coefficient stored in said storage area on the basis of said input address data.

* * * * *

UNITED STATES PATENT AND TRADEMARK OFFICE
CERTIFICATE OF CORRECTION

PATENT NO. : 6,442,580 B1
DATED : April 22, 2002
INVENTOR(S) : Hirosha Machida

It is certified that error appears in the above-identified patent and that said Letters Patent is hereby corrected as shown below:

Column 18,
Line 23, change the dependency of claim 8 from "3" to -- 6 --.

Signed and Sealed this

First Day of April, 2003

JAMES E. ROGAN
*Director of the United States Patent and Trademark Office*